United States Patent
Beatson

(10) Patent No.: US 6,531,916 B2
(45) Date of Patent: Mar. 11, 2003

(54) TRANSCONDUCTANCE CONTINUOUS TIME FILTER CIRCUIT

(75) Inventor: Trevor P. Beatson, Withington (GB)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/887,838

(22) Filed: Jun. 22, 2001

(65) Prior Publication Data

US 2002/0030540 A1 Mar. 14, 2002

(51) Int. Cl.[7] .................................................. H03B 1/00
(52) U.S. Cl. ....................................................... 327/552
(58) Field of Search ................................. 327/403, 404, 327/551, 552, 553, 560, 561, 562, 563; 330/252, 253, 254, 261

(56) References Cited

U.S. PATENT DOCUMENTS 5,297,157 A * 3/1994 Kaiser et al. ................. 372/26
5,619,169 A * 4/1997 Matsuura ..................... 330/254
5,847,605 A   12/1998 Mihailovits et al. ......... 330/252
6,069,866 A * 5/2000 Pietruszynski et al. ...... 330/254
6,104,226 A * 8/2000 Weber .......................... 327/355

* cited by examiner

*Primary Examiner*—Jeffrey Zweizig
(74) *Attorney, Agent, or Firm*—Christopher P. Maiorana, PC

(57) ABSTRACT

A transconductance continuous time filter circuit comprising a first differential pair of transistors (328 and 330), and at least one pair of tuning transistors (326 and 332). Each of the tuning transistors (326 and 332) may be coupled via a respective switching transistor (346 and 348) to a supply line, with the gate electrodes of the switching transistors (346 and 348) being coupled to a control line. The switching transistors (346 and 348) may be turned on or off to couple or uncouple the tuning transistors (326 and 332) from the first differential pair of transistors. The effective width of the differential pair may also be varied such that the transconductance and hence the cut-off frequency of the filter circuit.

20 Claims, 5 Drawing Sheets

TRANSCONDUCTANCE CONTINUOUS TIME FILTER CIRCUIT

FIELD OF THE INVENTION

The present invention relates, in general, to a transconductance continuous time filter circuit and method for maintaining a wide turning range without an excessive change in bias current or device operating conditions. The invention is particularly, but not exclusively, concerned with the implementation of such a filter circuit in CMOS (Complementary Metal-Oxide Silicon) technology.

BACKGROUND OF THE INVENTION

Modern mass storage data retrieval applications contain equalization circuitry to modify the recovered analog signal prior to any subsequent digital processing. Such analog equalization circuitry generally includes integrated continuous time filter circuits. Each of the integrated continuous time filter circuits generally comprises a plurality of biquadratic filters.

It is known to implement bipolar transistors in stacked active filter circuits. Where the filter must operate at a lower supply voltage, such as where a large number of stages are used in a filter such as in an integrated circuit implementation, a folded version of this architecture is preferable. In bipolar transistors, the small signal transconductance is directly proportional to the emitter current at which the device is biased. Therefore, in order to tune the filter by changing the transconductance, it is necessary to change the emitter current accordingly.

In many systems, however, it is preferable for both digital and analog parts of a system to utilize a common technology. The current dominant technology for digital circuitry is CMOS (Complementary Metal-Oxide Silicon), and hence it is desirable to provide an active filter circuit using MOS transistors in place of bipolar transistors.

However, in CMOS technology, the transconductance of a transistor operating in the saturated region is approximately proportional to the square root of the bias current. Therefore, to vary the cut-off frequency (determined by the transconductance), the bias current would need to be varied according to a square power law that would require much higher power.

It is therefore desirable to produce a continuous active filter circuit which can be implemented in CMOS technology and provides a wide turning range without requiring an excessive change in bias current or device operating conditions.

SUMMARY OF THE INVENTION

The present invention concerns a transconductance continuous time filter circuit having a wide tuning range comprising a first differential pair of transistors, at least one further pair of transistors, and at least one switch. The switch may be coupled to the at least one further pair of transistors. The switch may be turned on or off to couple or uncouple the at least one further pair of transistors from the first differential pair of transistors.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
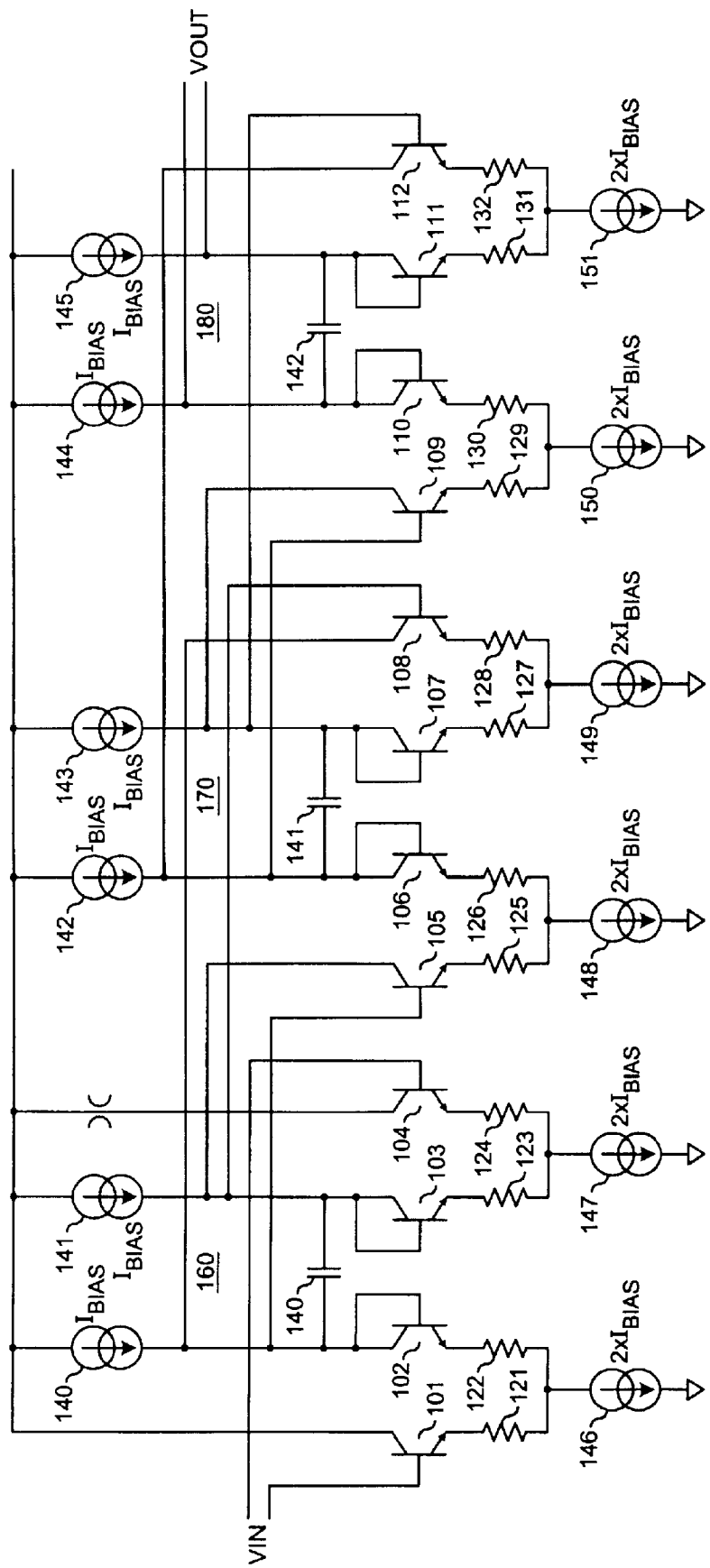
FIG. 1 is a schematic diagram of a conventional folded active filter circuit containing bi-polar transistors.

Referring to FIG. 1, a conventional folded active filter circuit is shown. Specifically, the folded active filter circuit of FIG. 1 illustrates a third order low pass folded filter circuit. The circuit of FIG. 1 is disclosed in U.S. Pat. No 5,847,605. The circuit comprises three stages 160, 170, 180, each having a first order transfer function. The differential outputs of a previous stage are fed to the differential inputs of the following stage. A differential input signal $V_{in}$ is applied to the base electrode of transistors 101 and 104, respectively. Each branch of the differential input signal is therefore applied to a different differential transistor pair 101, 102 and 103, 104. The differential transistor pairs 101, 102 and 103, 104 comprise the first stage of the filter circuit. The differential output of first stage is provided by the transistors 102 and 103. A load capacitor 140 is connected across the output of the first stage. The differential inputs to the second stage 170 are from the differential outputs of the first stage 160. The inputs are applied to differential transistor pairs 105, 106 and 107, 108. The third filter 180 presents an output from the transistors 110 and 111. Therefore, each of the stages 160, 170, 180 operates in a substantially similar manner.

Additionally, the circuit comprises current sources 140 to 151 and resistors 121 to 132. The resistors 121 to 132 are optional components in this circuit structure. The conventional folded filter circuit of FIG. 1 is illustrated using bipolar transistors. For a bipolar transistor, the emitter current $I_e$ is related to the base emitter voltage $V_{be}$ by the following equation:

$$I_e = I_s e^{\frac{qV_{be}}{kT}}$$

where q is the electronic charge, T the absolute temperature, k is Boltzman's constant and $I_s$ is the forward saturation current for the device.

By differentiating the above expression with respect to the base emitter voltage an expression for $g_m$, the small signal transconductance for a bipolar transistor, can be derived as follows:

$$\frac{\partial I_e}{\partial V_{be}} = g_m = I_e \frac{q}{kT} \quad (1)$$

The above expression shows that for a bipolar transistor the small signal transconductance $g_m$ is directly proportional to the emitter current $I_s$ at which the device is biased. For bipolar transistors, this linear relationship holds over many orders of magnitude. The variation in transconductance $g_m$ with absolute temperature implicit in equation (1) can also be removed by making the bias current proportional to absolute temperature. In this way, the transconductance can be made insensitive to many of the physical and process variables inherent in integrated circuit design.

Figure 2:
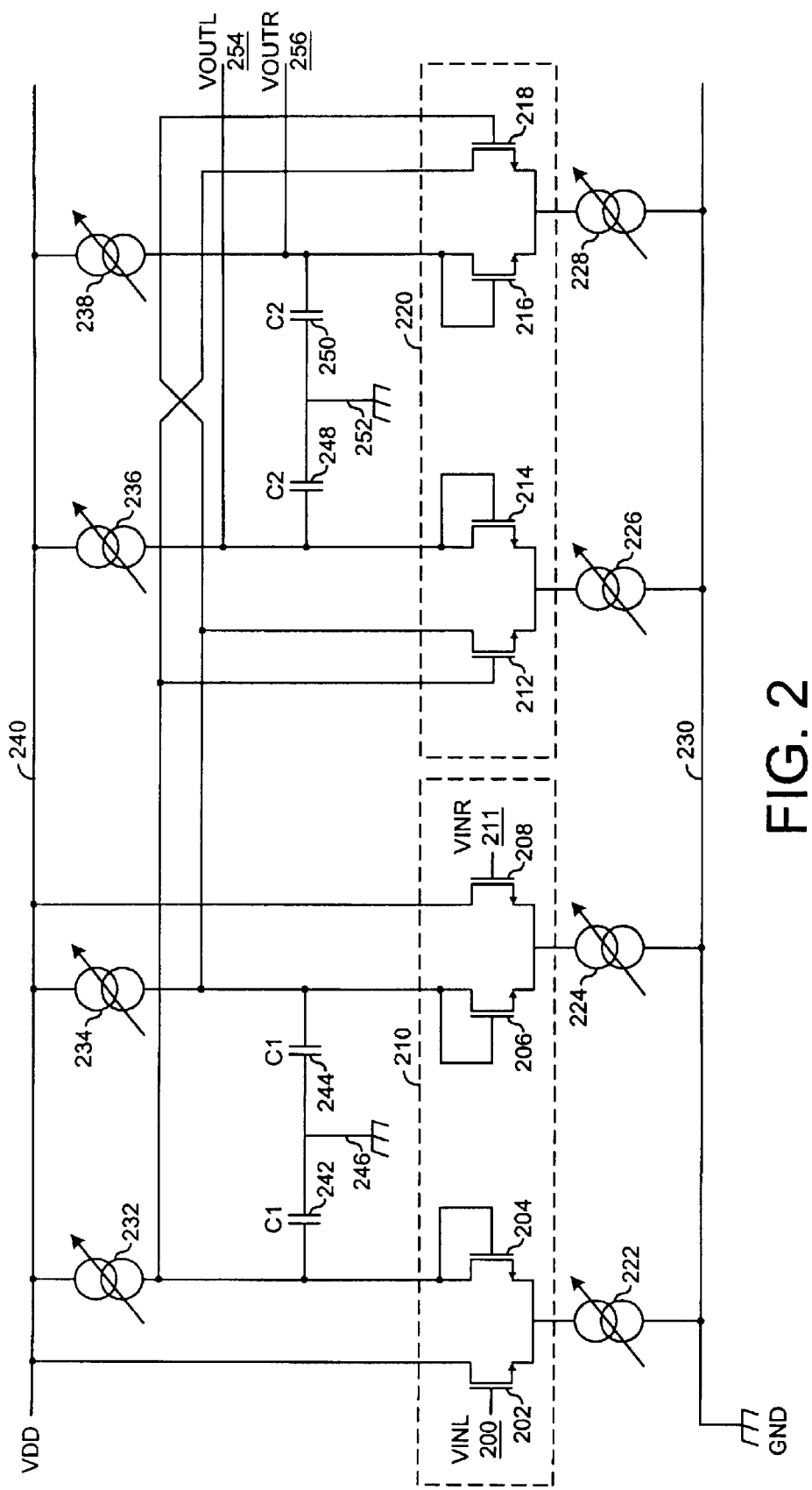
FIG. 2 is a schematic diagram of a conventional CMOS folded active filter circuit.

A conventional second order low pass filter circuit, implemented in CMOS technology is shown in FIG. 2 and comprises a first bi-quadratic filter section 210 and a second bi-quadratic filter section 220. The first bi-quadratic filter section 210 comprises a first differential pair of CMOS transistors 202 and 204, and a second differential pair of CMOS transistors 206 and 208. A differential input signal is coupled via a terminal 200 to a gate electrode of the CMOS transistor 202 and via a terminal 211 to a gate electrode of the CMOS transistor 208. Source electrodes of both the CMOS transistors 202 and 204 are coupled to a bias current source 222. Similarly, source electrodes of both the CMOS transistors 206 and 208 are coupled to a bias current source 224. A gate electrode of the CMOS transistor 204 is coupled to a source electrode and, similarly, a gate electrode of the CMOS transistor 206 is coupled to a source electrode. The source electrodes of CMOS transistors 204 and 206 are coupled via respective capacitors 242 and 244 to ground potential line 246. The source electrodes of the CMOS transistors 202 and 208 are coupled to a voltage supply line 240. The source electrodes of the CMOS transistors 204 and 206 are coupled to respective current sources 232 and 234.

The structure of the second bi-quadratic filter section 220 is similar to the first bi-quadratic filter section 210. However, a gate electrode of a CMOS transistor 212 may be coupled to the source electrode of the CMOS transistor 204. A gate electrode of a CMOS transistor 218 is coupled to the source electrode of the CMOS transistor 206. A filter output signal is output on lines 254 and 256 that are coupled to the source electrodes of CMOS transistors 214 and 216 respectively.

The structure illustrated in FIG. 2 is equivalent to the architecture of the conventional folded active filter circuit part of FIG. 1, except that it is implemented in CMOS technology. However, for a MOS transistor the relationship between drain current $I_d$ and gate source voltage $V_{gs}$ is given by:

$$I_d = \frac{\mu_0 C_{ox} WL}{2}(V_{gs} - V_t)^2$$

Where $\mu_0$ is the carrier mobility, $C_{ox}$ is the oxide capacitance, W and L are the width and length of the transistor channel, and $V_t$ the device threshold voltage.

By differentiating the above expression with respect to $V_{gs}$, an expression for the small signal transconductance, $g_m$, for the MOS device is derived:

$$\frac{\partial I_d}{\partial V_{gs}} = g_m = \sqrt{\frac{2\mu_0 C_{ox} W I_d}{L}} \quad (2)$$

For a MOS transistor the transconductance $g_m$ is proportional to the square root of the bias current $I_d$. For example, in order to vary the cut off frequency over a 16 to 1 range, the bias current $I_d$ would have to vary by a factor of over 250 which would result in excessive variation in device operating conditions such as $V_{gs}$ and $g_{ds}$ and a considerable variation in linearity. Even if the bias current could be varied by such an extreme ratio, the power dissipation at high cut off frequencies would be unacceptably high. Equation (2) illustrates that overall device transconductance will increase linearly as a consequence of increasing the width W of the transistor channel and $I_d$ in a linear manner. For example, doubling W and $I_d$ results in a doubling of overall device transconductance.

Figure 3:
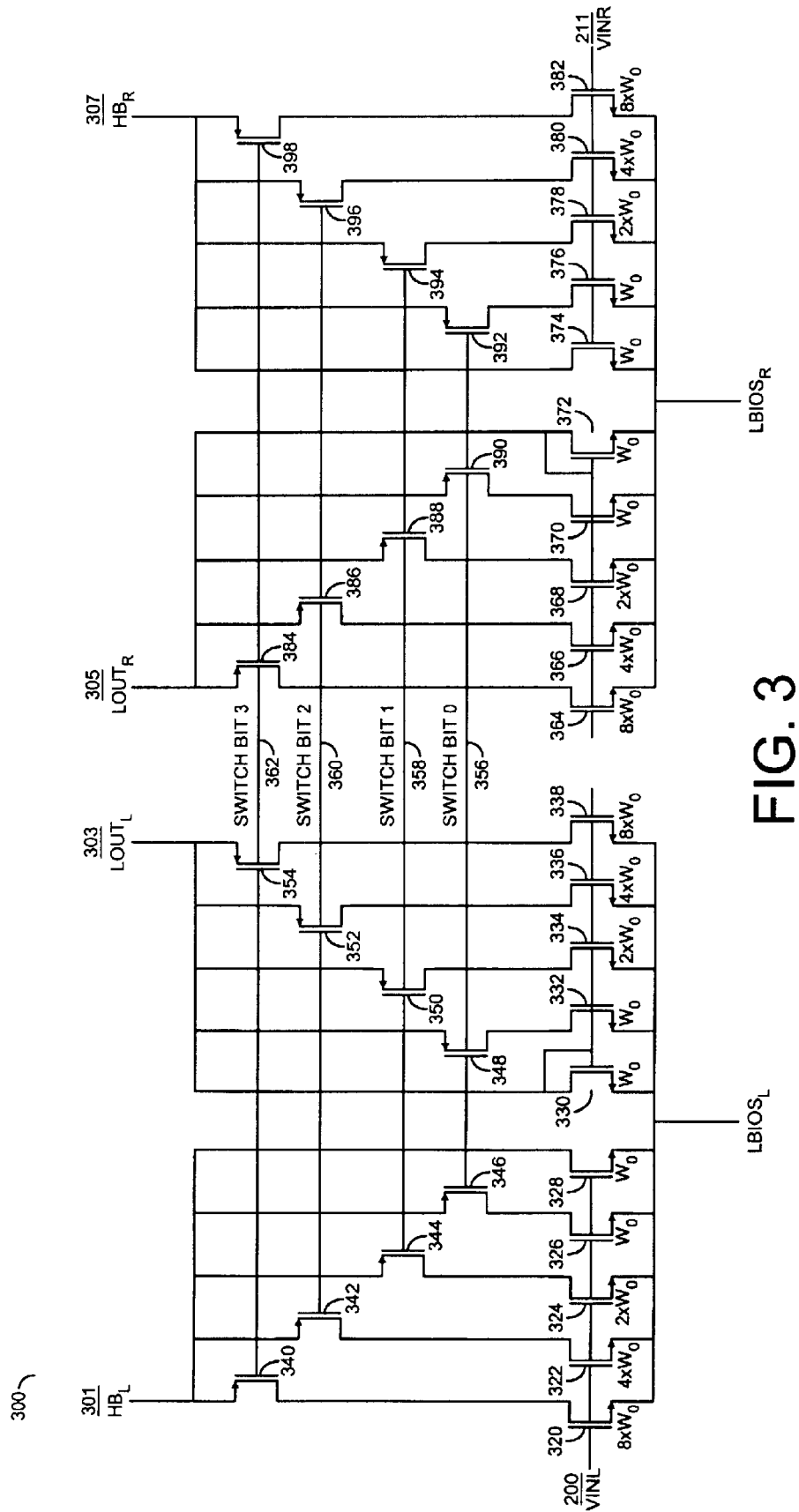
FIG. 3 is a schematic diagram of a scaled bi-quadratic CMOS filter section according to a first embodiment of the present invention.

In a first embodiment of the present invention, each bi-quadratic filter section, 210, 220 comprises a scaled bi-quadratic CMOS filter section. One such section 300 may be illustrated in FIG. 3. A left hand differential pair of NMOS transistors 328 and 330 may have source electrodes coupled to a bias current source $I_{biasL}$. The source electrode of transistor 328 may be coupled to power supply line $V_{DD}$ and the drain electrode of transistor 330 may be coupled to output terminal 303 and to a current source $I_{outL}$. The transistor 328 may have four NMOS tuning transistors 320, 322, 324 and 326 coupled in parallel, such that the source electrodes of each of the four tuning transistors are also coupled to the bias current source $I_{biasL}$. The gate electrodes of the transistor 328 and of each of the tuning transistors 320, 322, 324 and 326 may be coupled to an input 200 to receive a differential input signal $V_{inL}$. Each of the four tuning transistors 320, 322, 324 and 326, may have a source electrode coupled, via a respective switching transistor 340, 342, 344 and 346 to the power supply line $V_{DD}$. The channel widths $W_0$ of the tuning transistors may be scaled. For example, in a ratio of 8:4:2:1 by activating any desired number of switching transistors, via gate electrodes, any desired effective width of transistor 328 may be effected by switching the desired tuning transistors in parallel with the transistor 328. The gate electrodes of the tuning transistors 340, 342, 344 and 346 may be coupled to control lines 362,360,358 and 356, respectively, such that a switch bit on the particular control line may turn the particular tuning transistor on.

Similarly, the transistor 330 may have four NMOS tuning transistors 332,334, 336 and 338 coupled in parallel, such that the source electrodes of each of the four tuning transistors may also be coupled to the bias current source $I_{biasL}$. Each of the four tuning transistors 332, 334, 336 and 338, may have a source electrode coupled, via a respective switching transistor 348, 350, 352 and 354 to the power supply line $V_{DD}$. The channel widths of the tuning transistors may be scaled in a ratio of 8:4:2:1, such that by activating the switching transistors, via gate electrodes, the desired effective width of transistor 330 may be effected by switching the desired tuning transistors in parallel with the transistor 330. The gate electrodes of the tuning transistors 354, 352, 350 and 348 are coupled to control lines 356, 358, 360 and 362, respectively, such that a switch bit on the particular control line may turn the particular tuning transistor on. Thus it will be appreciated that, since the corresponding switching transistors having the same widths are coupled to the same control line, a switching bit on a control line will switch on a pair of switching transistors. A pair of tuning transistors may be switched on such that the effective width of each of the transistors making up the differential pair may remain the same.

In a similar fashion, the right hand differential pair of the biquadratic CMOS filter section generally comprises a second differential pair of NMOS transistors 372 and 374 having source electrodes coupled to a bias current source $I_{biasR}$. The source electrode of transistor 374 may be coupled to power supply line $V_{DD}$ and the drain electrode of transistor 372 may be coupled to the output terminal 305 and to a current source $I_{outR}$. The transistor 374 may have four NMOS tuning transistors 376, 378, 380 and 382 coupled in parallel, such that the source electrodes of each of the four tuning transistors may also be coupled to the bias current source $I_{biasR}$. The gate electrodes of transistor 374 and of each of the tuning transistors 376, 378, 380 and 382 may be coupled to an input 211 to receive differential input signal $V_{inR}$. Each of the four tuning transistors 376, 378, 380 and 382 may have a source electrode coupled, via a respective switching transistor 392, 394, 396 and 398 to the power supply line $V_{DD}$. The channel widths of the tuning transistors may be scaled in a ratio of 8:4:2:1, such that by activating any desired number of switching transistors, via their gate electrodes, any desired effective width of transistor 374 can be effected by switching the desired tuning transistors in parallel with the transistor 374. The gate electrodes of the tuning transistors 392, 394, 396 and 398 may be coupled to control lines 356, 358, 360 and 360, respectively, such that a switch kit on the particular control line will turn the particular tuning transistor on.

Similarly, the transistor 372 may have four N MOS tuning transistors 364, 366, 368 and 370 coupled in parallel, such that the source electrodes of each of the four tuning transistors may also be coupled to the bias current source $I_{biasR}$. Each of the four tuning transistors 364, 366, 368 and 370, may have a source electrode coupled, via a respective switching transistor 384, 386, 388 and 390 to the power supply line $V_{DD}$. The channel widths of the tuning transistors may be scaled in a ratio of 8:4:2:1, such that, by activating any claimed number of switching transistors, via their gate electrodes, any desired effective width of transistor 372 can be effected by switching the desired tuning transistors in parallel with the transistor 372. The gate electrodes of the tuning transistors 384, 386, 388 and 390 may be coupled to control lines 356, 358, 360 and 360, respectively, such that a switch kit on the particular control line will turn the particular tuning transistor on. By turning on the switching transistors, while simultaneously adjusting the bias current, it may be possible to increase transconductance in a linear manner which is equivalent to having a device of any width between a minimum value and a set maximum value.

Figure 4:
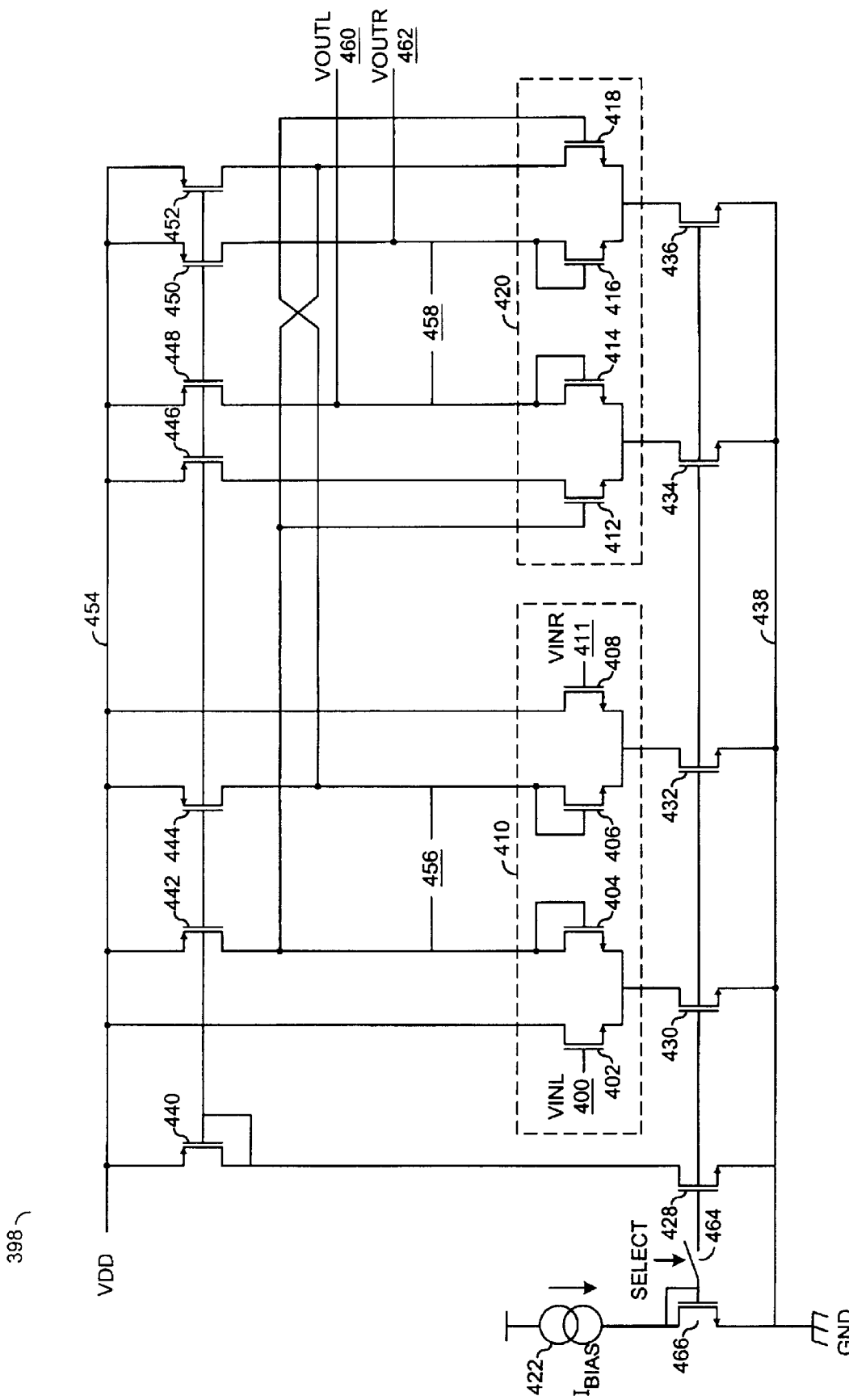
FIG. 4 is a schematic diagram of a CMOS filter circuit portion according to a second embodiment of the present invention.

For MOS technologies where the maximum supply voltage is limited, for example in a 3V or 2.5V process, there may be insufficient voltage available to power the PMOS switches in the sources of the scaled differential pairs of tuning transistors. In such circumstances, it may be possible to use an alternate switching arrangement. The PMOS switches may be removed from the sources of the tuning transistors and used, instead, to perform the switching by turning on or off the tail currents of the differential pairs, as shown in FIG. 4. In a second embodiment of the present invention, FIG. 4 schematically shows a switching circuit portion 398 including a pair of bi-quadratic filter sections 410 and 420. Other switching circuit portions, similar to that shown in FIG. 4 are constructed by repeating the circuitry shown in FIG. 4 and progressively switching filter sections in parallel to increase the total transconductance $g_m$ and hence filter cut-off frequency.

As shown in FIG. 4, the first bi-quadratic filter section 410 generally comprises a first differential pair of CMOS transistors 402 and 404, and a second differential pair of CMOS transistors 406 and 408. A differential input signal $V_{in}$ may be coupled via a terminal 400 to a gate electrode of the CMOS transistor 402 and via a terminal 411 to a gate electrode of the CMOS transistor 408. Source electrodes of both CMOS transistors 402 and 404 may be coupled via a current sink transistor 430 to ground reference potential Gnd. Similarly, a source electrode of both the CMOS transistors 406 and 408 may be coupled via a current sink transistor 432 to ground reference potential Gnd. A gate electrode of CMOS transistor 404 may be coupled to its source electrode and, similarly, a gate electrode of CMOS transistor 406 is coupled to its source electrode.

A source electrode of each of the CMOS transistors 402 and 408 may be coupled to a voltage reference potential $V_{dd}$ on supply line 454. The source electrode of each of the CMOS transistors 404 and 406 may be coupled to current source PMOS transistors 442 and 444, respectively that are coupled to voltage $V_{dd}$ on supply line 454. The source electrodes of transistors 404 and 406 may also be coupled, via terminal 456 to a shared capacitor $C_1$ (not shown). The structure of the second bi-quadratic filter section 420 may be similar to the first bi-quadratic filter section 410. However, a gate electrode of a CMOS transistor 412 may be coupled to the source electrode of CMOS transistor 404. A gate electrode of a CMOS transistor 418 may be coupled to the source electrode of CMOS transistor 406, and a source electrode of a CMOS transistor 418 may be coupled to the source electrode of CMOS transistor 404.

A differential filter output signal $V_{out}$ may be output on lines 460 and 462 that may be coupled to the source electrodes of CMOS transistors 414 and 416 respectively. The source electrodes of CMOS transistors 412 and 414 may be coupled to current source PMOS transistors 446 and 448 respectively that may be coupled to the voltage reference supply line 454. The source electrode of a further second differential pair of CMOS transistors 416 and 418 are similarly coupled to current source PMOS transistors 450 and 452, respectively that may be coupled to the voltage reference supply line 454. Source electrodes of both the CMOS transistor 412 and 414 may be coupled via a current sink transistor 434 to ground reference potential Gnd. Similarly, a source electrode of both the CMOS transistors 416 and 418 may be coupled via a current sink transistor 436 to ground reference potential Gnd. The source electrodes of transistors 414 and 416 may also be coupled, via terminal 458 to a shared capacitor $C_2$ (not shown).

The gate electrodes of current sink transistors 430, 432, 434 and 436 may be coupled to a gate electrode of a transistor 428 that may be coupled between the ground reference potential Gnd on line 438 and a reference transistor 440 that may be coupled to the voltage supply $V_{dd}$ on line 454 and which has its gate electrode coupled to the gate electrodes of transistors 442, 444, 446, 448, 450 and 452. The gate electrode of switching transistor 428 may also be coupled, via a switch 464 to the gate and source electrodes of reference transistor 466 and to a bias current source 422. The source electrode of transistor 466 may be coupled to ground reference potential Gnd on line 438. The switch 464 may be controlled from a Select bus 470 that may be used to control the position of switch 464.

Thus, the pair of bi-quadratic filter sections 410 and 420 may be switched on or off by selecting the position of switch 464. If the switch is off, then the switching transistors 428, 430, 432, 434 and 436 may be switched off and the differential pairs may not be connected to ground reference potential line 438. If, on the other hand, the switch 464 is on, then the switching transistors 428, 430, 432, 434 and 436 may be switched on and the differential pairs may be connected to ground reference potential line 438.

Figure 5:
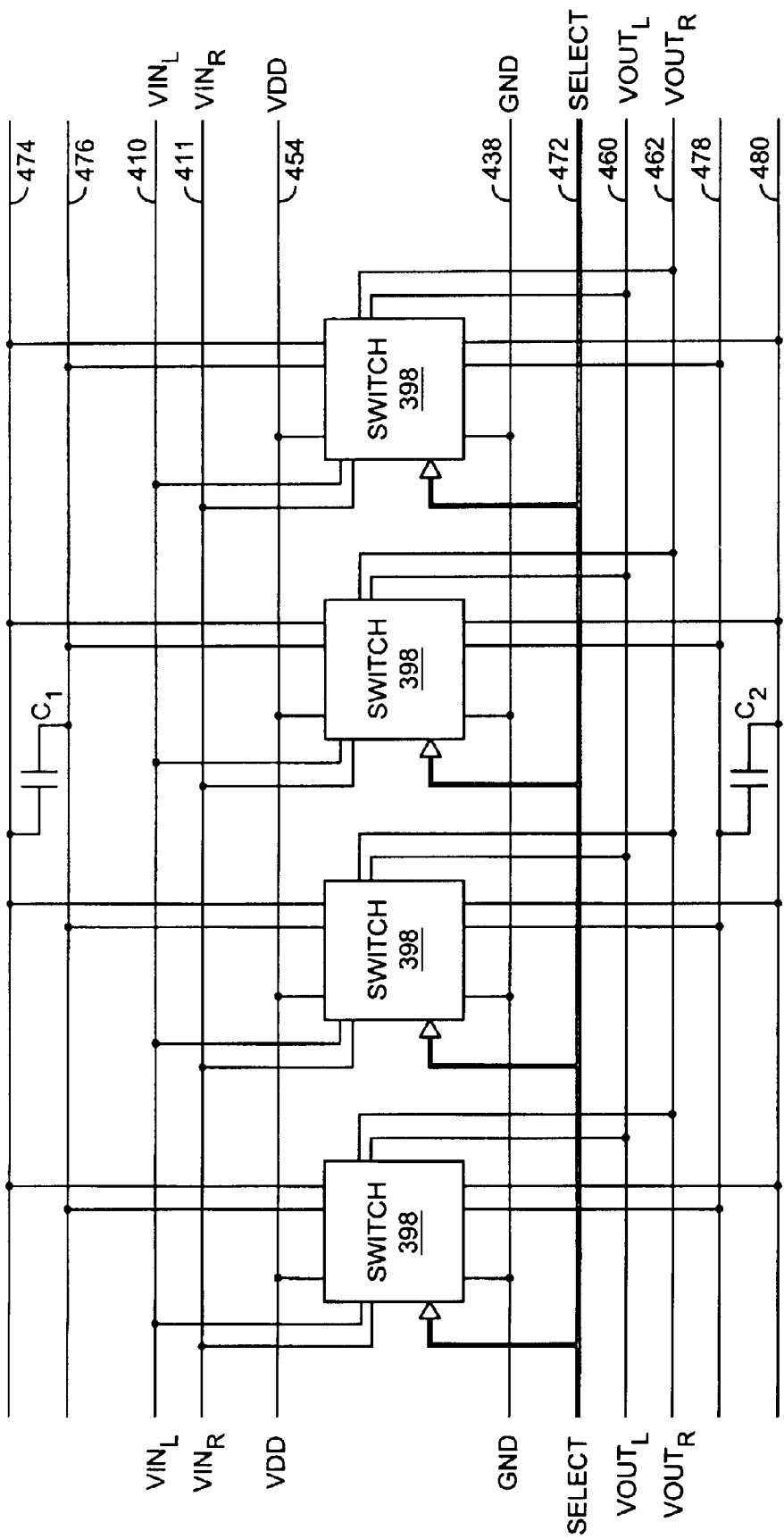
FIG. 5 is a schematic block diagram of the way a number of the filter circuit portions of FIG. 4 can be coupled together.

As shown in FIG. 5, a number of similar switching circuit portions 398, of which four are shown, but any desired number can be implemented, may be coupled in parallel to receive the differential input signal $V_{in}$ on lines 400 and 411 and to provide the differential output signal $V_{out}$ on lines 460 and 462. The circuit portions 398 may each be coupled to the voltage supply $V_{DD}$ on line 454 and the ground reference Gnd on line 438 and to a Select bus 472 that may be used to control the switches in each of the circuit portions 398. Each of the circuit portions may also be coupled to shared capacitor $C_1$ via lines 474 and 476 and to shared capacitor $C_2$ via lines 478 and 480.

It is thus possible to vary the total transconductance by switching a required number of circuit portions 398 into the circuit. This effectively increases the total width of the transistor function within the filter circuit. The further circuit portions 398 may be scaled, as described above with reference to the first embodiment of the invention, such that, by appropriately choosing which portions to switch on, any transconductance required between a set minimum and a set maximum level can be obtained that leads to a regular structure for the filter, making it well suited to integrated circuit implementation.

It will be appreciated that although only two particular embodiments of the invention have been described in detail, various modifications and improvements can be made by a person skilled in the art without departing from the scope of the present invention. For example, in the second embodiment, although the circuit portions 398 have been shown as each having a separate connection from the gate electrode of reference transistor 440 to the gate electrodes of current source transistors 442, 444, 446, 448, 450 and 452, the current source transistors of all the circuit portions 398 can have their gate electrodes coupled together.

While the invention has been particularly shown and described with reference to the preferred embodiments thereof, it will be understood by those skilled in the art that various changes in form and details may be made without departing from the spirit and scope of the invention.

What is claimed is:

1. A transconductance continuous time filter circuit having a wide tuning range, the filter circuit comprising:
   a first differential pair of transistors;
   a second differential pair of transistors;
   at least one third differential pair of transistors; and
   at least one first pair of switches configured to couple in parallel the at least one third differential pair of transistors with the first differential pair of transistors, wherein the first and second differential pairs of transistors form a bi-quadratic filter section.

2. The apparatus according to claim 1, wherein said apparatus comprises a DVD read circuit.

3. The filter circuit according to claim 1, wherein the filter circuit is implemented in Complementary Metal Oxide Silicon (CMOS) technology.

4. The filter circuit according to claim 3, wherein:
   each of the at least one third differential pair of transistors comprises:
      a first CMOS transistor having a first and a second current electrode coupled to a corresponding first and second current electrode of a first transistor of the first differential pair of transistors and a control electrode coupled to a corresponding control electrode of the first transistor of the first differential pair of transistors; and
      a second CMOS transistor having a first and a second current electrode coupled to a corresponding first and second current electrode of a second transistor of the first differential pair of transistors and a control electrode coupled to a corresponding control electrode of the second transistor of the first differential pair of transistors; and
   wherein each of the at least one first pair of switches comprises:
      a first switch coupled to the first current electrode of the first CMOS transistor; and
      a second switch coupled to the first current electrode of the second CMOS transistor.

5. The filter circuit according to claim 4, wherein the first switch comprises a CMOS transistor having a first current electrode coupled to the first current electrode of the first CMOS transistor, a second current electrode coupled to a supply line, and a control electrode coupled to a first control signal line.

6. The filter circuit according to claim 4, wherein the second switch comprises a CMOS transistor having a first current electrode coupled to the first current electrode of the second CMOS transistor, a second current electrode coupled to a supply line, and a control electrode coupled to a second control signal line.

7. The filter circuit according to the claim 4, further comprising:
   at least one fourth differential pair of transistors, each comprising:
   a first CMOS transistor having a first and a second current electrode coupled to the corresponding first and second current electrode of the first transistor of the second differential pair of transistors and a control electrode coupled to a corresponding control electrode of the first transistor of the second differential pair of transistors;
   a second CMOS transistor having a first and a second current electrode coupled to a corresponding first and second current electrode of the second transistor of the second differential pair of transistors and a control electrode coupled to a corresponding control electrode of the second transistor of the second differential pair of transistors; and
   at least one second pair of switches configured to couple in parallel the at least one fourth differential pair of transistors with the second differential pair of transistors, each of the at least one second pair of switches being coupled to the first current electrode of one of the transistors of the at least one fourth differential pair of transistors.

8. The filter circuit according to claim 7, wherein the second and fourth differential pairs of transistors comprise sets of scaled transistors.

9. The filter circuit according to claim 8, wherein the sets of scaled transistors comprise CMOS transistors with predetermined channel widths.

10. The filter circuit according to claim 9, wherein the sets of scaled transistors are switched in or out of the circuit in order to vary the effective channel widths of the first and second differential pairs of transistors.

11. The filter circuit according to claim 7, wherein the first differential pair of transistors, the at least one third differential pair of transistors, the second differential pair of transistors, and the at least one fourth differential pair of transistors form one or more bi-quadratic filter sections.

12. The filter circuit according to claim 7, wherein the second differential pair of transistors comprises a pair of CMOS transistors each having a first current electrode coupled together.

13. The filter circuit according to the claim 3, further comprising:
   a plurality of further differential pairs of transistors; and
   a plurality of further switches, each switch being coupled to a current electrode of a respective pair of transistors of the plurality of further differential pairs of transistors.

14. The filter circuit according to claim 13, wherein the plurality of further differential pairs of transistors comprise a set of scaled transistors.

15. The filter circuit according to claim 14, wherein the set of scaled transistors are CMOS transistors with predetermined channel widths.

16. The filter circuit according to claim 15, wherein the scaled transistors can be switched in or out of the circuit in order to vary the effective channel widths of the second differential pair of transistors.

17. The filter circuit according to claim 1, wherein the filter circuit comprises a transconductance continuous time filter circuit.

18. A transconductance continuous time filter circuit having a wide tuning range, the filter circuit comprising:

means for implementing a first differential pair of transistors;

means for implementing a second differential pair of transistors;

means for implementing at least one third differential pair of transistors;

means for switching coupled to the at least one third differential pair of transistors, whereby the switch can be turned on or off to couple or uncouple the at least one third differential pair of transistors from the first differential pair of transistors; and wherein the first and second differential pairs of transistors form a bi-quadratic filter section.

19. A method for implementing a transconductance continuous time filter having a wide tuning range, comprising the steps of:

coupling at least one switch to at least one third differential pair of transistors;

turning said switch on or off to couple or uncouple the at least one third differential pair of transistors from a first differential pair of transistors; and implementing a second differential pair of transistors, wherein the first and second differential pairs of transistors form a bi-quadratic filter section.

20. A transconductance continuous time filter circuit having a wide tuning range, the filter circuit comprising:

a first one or more differential pair of transistors;

at least one further pair of transistors;

at least one switch coupled to the at least one further pair of transistors, whereby the switch can be turned on or off to couple or uncouple the at least one further pair of transistors from the first differential pair of transistors;

wherein (i) the filter circuit is implemented in Complementary Metal Oxide Silicon (CMOS) technology and (ii) the first one or more differential pairs of transistors and a second one or more differential pairs of transistors form one or more bi-quadratic filter sections.

* * * * *